United States Patent [19]
Weitzel et al.

[11] Patent Number: 5,852,316
[45] Date of Patent: Dec. 22, 1998

[54] COMPLEMENTARY HETEROJUNCTION AMPLIFIER

[75] Inventors: Charles E. Weitzel, Mesa; Carl Shurboff, Gilbert, both of Ariz.

[73] Assignee: Motorola, Inc., Schaumburg, Ill.

[21] Appl. No.: 298,721

[22] Filed: Aug. 31, 1994

[51] Int. Cl.$^6$ .......................... H01L 29/76; H01L 29/94; H01L 31/062; H01L 31/113

[52] U.S. Cl. ............................................................ 257/369

[58] Field of Search ............................................. 257/369

[56] References Cited

U.S. PATENT DOCUMENTS 5,329,184  7/1994  Redfern ................................... 257/369

OTHER PUBLICATIONS

Irwin, *Basic Engineering CK & Analysis*, pp. 332–333, 1984.
K. W. Kobayashi et al., "Complementary HBT Push–Pull Amplifier by Selective MBE", IEEE Microwave and Guided Wave Letters, vol. 2, No. 4, Apr. 1992, pp. 149–150.

*Primary Examiner*—Stephen D. Meier
*Attorney, Agent, or Firm*—William E. Koch

[57] ABSTRACT

A gallium arsenide amplifier (10) utilizes a P-channel heterojunction transistor (12) and an N-channel heterojunction transistor (11) connected in a stacked configuration. The gate width of the P-channel heterojunction transistor is scaled so that the transconductance of the P-channel heterojunction transistor approximately equals the transconductance of the N-channel heterojunction transistor. The gate length (44) of the N-channel heterojunction transistor is scaled so that the input impedance of the N-channel heterojunction transistor approximately equals the input impedance of the P-channel heterojunction transistor.

12 Claims, 1 Drawing Sheet

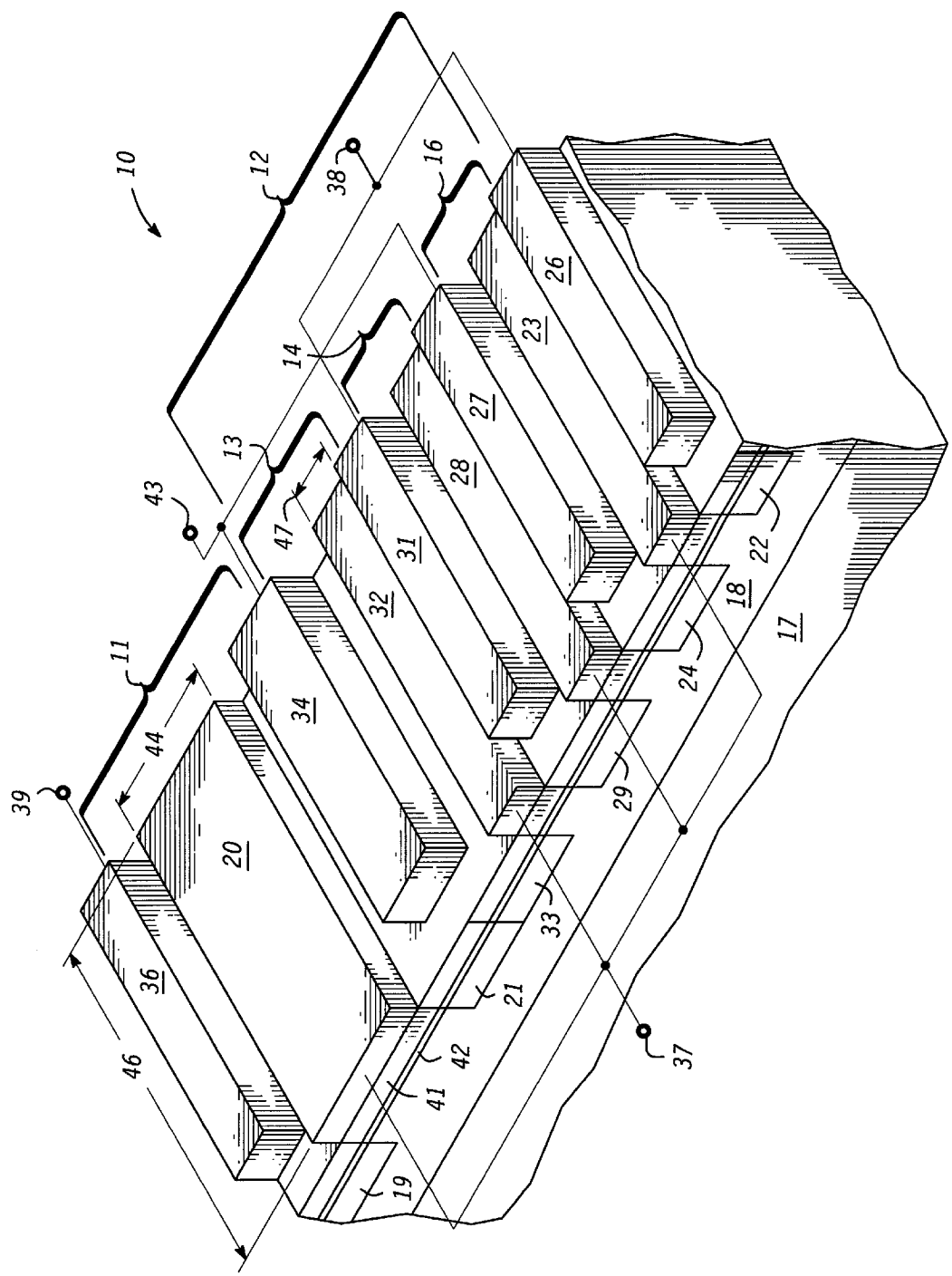

COMPLEMENTARY HETEROJUNCTION AMPLIFIER

BACKGROUND OF THE INVENTION

The present invention relates, in general, to semiconductor devices, and more particularly, to a novel semiconductor amplifier.

In the past, gallium arsenide (GaAs) transistors have been utilized to implement radio frequency (RF) amplifiers with operating frequencies generally above 100 MHz. These prior amplifiers generally utilize N-channel transistors for the active amplifier device. The N-channel transistor is typically biased at a D.C. quiescent operating point that is between a positive and negative voltage so that an input signal can be amplified by the transistor. Because of the biasing, the amplifier dissipates power even when a signal is not applied to the amplifier input. For example, such an RF power amplifier for a cellular telephone could have a quiescent power dissipation of approximately 900 milliwatts (150 milliamps at 6 volts). Such a high power dissipation limits the useful operating time of the cellular telephone.

Accordingly, it is desirable to have an amplifier that utilizes less than 900 milliwatts (150 milliamps) during quiescent operating conditions.

BRIEF DESCRIPTION OF THE DRAWINGS

The sole FIGURE illustrates an enlarged cross-sectional perspective view of an amplifier in accordance with the present invention.

DETAILED DESCRIPTION OF THE DRAWINGS

The sole FIGURE illustrates an enlarged perspective view of a cross-sectional portion of a complementary gallium arsenide heterojunction amplifier 10. Amplifier 10 utilizes a complementary transistor pair that includes a N-channel heterojunction field effect transistor 11 and a P-channel heterojunction field effect transistor 12 that are interconnected together in a stacked configuration. Transistor 12 is formed as three parallel heterojunction field effect transistors including a first transistor 13, a second transistor 14, and a third transistor 16. Transistor 12 is broken into transistors 13, 14, and 16 in order to minimize the area occupied by amplifier 10.

Transistors 11 and 12 are fabricated with a complementary GaAs process. The process utilizes a gallium arsenide (GaAs) substrate 17 that is covered with an epitaxial GaAs buffer layer 18. Layer 18 is formed by molecular beam epitaxy (MBE), metal-organic chemical vapor deposition (MOCVD), or other epitaxial processes that are well known to those skilled in the art. A channel layer 42 is formed on buffer layer 18. The material utilized for layer 42 facilitates forming a two dimensional electron gas and preferably comprises undoped indium gallium arsenide (InGaAs). On top of layer 42 an insulating layer 41 is epitaxially grown in order to reduce forward gate conduction and to allow for increased gate drive level for transistors 11 and 12. Preferably, insulating layer 41 includes undoped aluminum gallium arsenide having an aluminum arsenide mole fraction of at least 70 per cent to minimize gate leakage of transistors 11 and 12.

An N-channel gate 20 is formed on layer 41 in the region wherein transistor 11 is formed. A first P-channel gate 23, a second P-channel gate 28, and a third P-channel gate 32 are formed in the regions wherein transistors 16, 14, and 13, respectively, are formed. As will be seen hereinafter, the length and width of gates 20, 23, 28, and 32 are chosen to provide extremely low quiescent power dissipation and to minimize distortion in the output signal of amplifier 10. Gates 20, 23, 28, and 32 typically are formed by applying a gate material and utilizing reactive ion etching techniques to pattern the gate material. Such techniques are well known to those skilled in the art. Preferably, the material used for gates 20, 23, 28, and 32 is titanium tungsten nitride (TiWN). Gate 20 is utilized as a mask for ion implanting an N-type source region 19 and a N-type drain region 21 for transistor 11. Similarly, gates 23, 28, and 32 are used as a mask while forming P-type source and drain regions of transistors 13, 14, and 16. Source 22 is formed adjacent gate 23 and functions as both the source of transistor 16 and as a first source of transistor 12. A drain 24 is positioned between gates 23 and 28 so that drain 24 functions as a drain of both transistors 14 and 16, and also as a first drain of transistor 12. A source 29 is in between gate 28 and gate 32 in order to function as a source of both transistor 13 and transistor 14, and also as a second source of transistor 12. A drain 33 of transistor 13 is positioned adjacent gate 32 and abutting drain 21 of transistor 11. Such a configuration facilitates utilizing a single drain contact 34 for both transistor 11 and transistor 13. Consequently, contact 34 overlaps both drain 21 and drain 33.

Other contacts are provided for other source and drain regions of transistors 11 and 12. Transistor 11 has a source contact 36 on source 19. Transistor 12 has a source contact 31 on source 29 which serves as a source contact for both transistors 13 and 14. Similarly, a drain contact 27 on drain 24 functions as a drain contact for both transistors 14 and 16. A source contact 26 on source 22 functions as a source contact for transistor 16. Source contacts 26 and 31 are connected together in parallel, and drain contacts 27 and 34 are connected in parallel so that transistors 13, 14, and 16 function as a single transistor 12. Also, contacts 26 and 31 are connected to first power supply terminal 38 that typically is connected to the positive terminal of an external power supply. Contact 36 is connected to a second power supply terminal 39 that typically is connected to an external negative power supply. Gates 20, 23, 28, and 32 are connected in parallel and to an input 37 of amplifier 10 to facilitate applying an external signal to amplifier 10. Contacts 34 and 27 are connected in parallel and to an output terminal 43 in order to provide an output signal for amplifier 10.

Both the length and width of gates 20, 23, 28, and 32 are chosen to minimize the quiescent power dissipation of amplifier 10 and to ensure that the output signal on terminal 43 is an accurate reproduction of signals applied to input 37. The length and the width of gates 20, 23, 28, and 32 are scaled so that transistors 11 and 12 have substantially the same input impedance ($Z_{in}$) and transconductance ($G_m$) at a desired D.C. operating point, thus, the magnitude of the threshold voltage of transistor 12 is substantially equal to the magnitude of the threshold voltage of transistor 11.

To achieve this result, gate 20 has a width 46 that is chosen to be as wide as possible without reducing the gain of transistor 11. If width 46 is too large, gain is reduced, and if width 46 is too small, the aspect ratio between transistors 11 and 12 results in inefficient utilization of chip area. In the preferred embodiment width 46 is approximately two hundred microns. Width 46 establishes an N-channel transconductance ($G_{mn}$) for transistor 11. Transistor 12 has a gate width that is chosen to provide a P-channel transconductance ($G_{mp}$) that is substantially equal to the N-channel transconductance, that is, $G_{mn}=G_{mp}$. In the preferred embodiment, each of transistors 13, 14, and 16 have a gate width that is equal to width 46 of transistor 11. The gate width of transistor 12 is the sum of the widths of each of transistors 13, 14, and 16, thus, the gate width of transistor 12 is approximately three times the gate width of transistor 11.

The gate length of transistor 12 is chosen to be the minimum that can be achieved by the equipment used for manufacturing amplifier 10. Because transistors 13, 14, and 16 are parallel connected, the gate length of transistor 12 is equal to the average gate length of transistors 13, 14, and 16. In the preferred embodiment, the length of each of transistors 13, 14, and 16 are equal to length 47 of transistor 13, thus, the gate length of transistor 12 is equal to the length of any one of transistors 13, 14, and 16 or length 47. Because the gate width of transistor 12 is larger than width 46 of gate 20, the input impedance of transistor 12 is smaller than the input impedance of transistor 11. It has been found that increasing the gate length of transistor 11 reduces the input impedance of transistor 11 with only a minor affect on the transconductance of transistor 11. Consequently, transistor 11 has a gate length 44 that is larger than the gate length of transistor 12 so that the input impedance of transistors 11 and 12 are substantially equal. In the preferred embodiment, length 44 is approximately three times length 47.

By matching the input impedance and transconductance of transistors 11 and 12, both transistors have the same gain and amplifier 10 accurately reproduces the wave shape of the signal applied to input 37. Because transistors 11 and 12 have the same threshold voltage magnitude (although the signs are opposite), both transistor 11 and transistor 12 can be inactive when no signal is applied to input 37 thereby resulting in amplifier 10 having low quiescent power dissipation. To achieve such, the voltage values applied to terminals 38 and 39 are selected so that the voltage applied to terminal 38 minus the voltage applied to terminal 39 is approximately equal to the threshold voltage of transistor 11 minus the threshold voltage of transistor 12. In one example of the preferred embodiment of amplifier 10, transistor 12 has a quiescent current no greater than approximately 0.003 milliamps and transistor 11 has a quiescent current no greater than approximately 0.12 milliamps resulting in quiescent power dissipation of approximately 0.246 milliwatts. This is much less than the quiescent power dissipation of prior art amplifiers wherein a single N-channel transistor is biased to amplify an input signal and has a quiescent current consumption of approximately 1.0 milliamps and a quiescent power dissipation of approximately 2.5 milliwatts. Additionally, the distortion of the output signal produced by amplifier 10 is reduced by approximately twenty decibels compared to prior art amplifiers using complementary digital transistors.

Although the description of the sole FIGURE explains a GaAs amplifier, the technique and structure utilized to achieve the low power dissipation and low distortion is applicable to transistors made from other III–V materials.

By now it should be appreciated that there has been provided a novel amplifier having low quiescent power dissipation. Choosing the P-channel transistor gate width to ensure that the P-channel transconductance is substantially equal to the N-channel transconductance, and by choosing the N-channel gate length to ensure the impedance is substantially equal to the P-channel input impedance facilitates having low quiescent power dissipation. The low power dissipation is important in battery operated applications such as cellular telephones, and enables having longer air time from a battery.

We claim:

1. A complementary heterojunction amplifier comprising:
    a P-channel heterojunction transistor having a first gate width, a first transconductance, and a first input impedance; and
    an N-channel heterojunction transistor having a first gate length, a second transconductance, and a second input impedance wherein the first gate width has a value so that the first transconductance and the second transconductance are approximately equal and wherein the first gate length has a value so that the first input impedance is approximately equal to the second input impedance.

2. The amplifier of claim 1 wherein the first gate width is at least approximately three times a second gate width of the N-channel heterojunction transistor.

3. The amplifier of claim 2 wherein the first gate width is at least approximately 600 microns.

4. The amplifier of claim 1 wherein the first gate length is at least approximately three times a second gate length of the P-channel heterojunction transistor.

5. The amplifier of claim 4 wherein the first gate length is at least approximately 3 microns.

6. The amplifier of claim 1 wherein the P-channel heterojunction transistor has a threshold voltage magnitude approximately equal to a threshold voltage magnitude of the N-channel heterojunction transistor.

7. The amplifier of claim 1 further including a first voltage applied to a source of the P-channel heterojunction transistor and a second voltage applied to a source of the N-channel heterojunction transistor wherein the first voltage minus the second voltage is approximately equal to a threshold voltage of the N-channel heterojunction transistor minus a threshold voltage of the P-channel heterojunction transistor.

8. A complementary heterojunction gallium arsenide amplifier comprising:
    an N-channel heterojunction gallium arsenide transistor having a first gate width, a first gate length, a first transconductance, and a first input impedance; and
    a P-channel heterojunction gallium arsenide transistor having a second gate width, a second gate length, a second transconductance, and a second input impedance wherein the second gate width has a value so that the first transconductance and the second transconductance are approximately equal and wherein the first gate length has a value so that the first input impedance is approximately equal to the second input impedance.

9. The amplifier of claim 8 wherein the second gate width is at least approximately three times the first gate width.

10. The amplifier of claim 9 wherein the second gate width is at least approximately 600 microns and the first gate width is at least approximately 200 microns.

11. The amplifier of claim 8 wherein the first gate length is at least approximately three times the second gate length.

12. The amplifier of claim 11 wherein the first gate length is at least approximately 3 microns and the second gate length is at least approximately 1 micron.

\* \* \* \* \*